(12) United States Patent
Zhou

(10) Patent No.: US 12,136,459 B2
(45) Date of Patent: Nov. 5, 2024

(54) MIXED WRITE CURSOR FOR BLOCK STRIPE WRITING

(71) Applicant: Micron Technology, Inc., Boise, ID (US)

(72) Inventor: Donghua Zhou, Suzhou (CN)

(73) Assignee: Micron Technology, Inc., Boise, ID (US)

( * ) Notice: Subject to any disclaimer, the term of this patent is extended or adjusted under 35 U.S.C. 154(b) by 246 days.

(21) Appl. No.: 17/823,674

(22) Filed: Aug. 31, 2022

(65) Prior Publication Data

US 2024/0062823 A1    Feb. 22, 2024

(30) Foreign Application Priority Data

Aug. 19, 2022  (CN) .......................... 202210999361.6

(51) Int. Cl.
    *G11C 16/10*    (2006.01)
    *G06F 3/06*    (2006.01)
    *G06F 12/02*    (2006.01)
    *G11C 16/08*    (2006.01)
    *G11C 16/16*    (2006.01)

(52) U.S. Cl.
CPC .......... *G11C 16/102* (2013.01); *G06F 3/0616* (2013.01); *G06F 3/064* (2013.01); *G06F 3/0656* (2013.01); *G06F 3/0679* (2013.01); *G06F 3/0688* (2013.01); *G06F 12/0246* (2013.01); *G11C 16/08* (2013.01); *G11C 16/10* (2013.01); *G11C 16/16* (2013.01)

(58) Field of Classification Search
CPC ........ G11C 16/102; G11C 16/08; G11C 16/16; G11C 16/10
See application file for complete search history.

(56) References Cited

U.S. PATENT DOCUMENTS

| | | | |
|---|---|---|---|
| 11,593,262 B1* | 2/2023 | Henze ................. | G06F 12/0238 |
| 2011/0078496 A1* | 3/2011 | Jeddeloh ................ | G06F 3/064 |
| | | | 714/E11.062 |
| 2015/0261797 A1* | 9/2015 | Alcantara ............. | G06F 3/0656 |
| | | | 707/813 |
| 2015/0317210 A1* | 11/2015 | Palmer ................ | G06F 11/1441 |
| | | | 714/6.3 |
| 2019/0034348 A1* | 1/2019 | Haswell .............. | G06F 12/1009 |
| 2021/0165576 A1* | 6/2021 | Koch .................... | G06F 3/0644 |

* cited by examiner

*Primary Examiner* — Mushfique Siddique
(74) *Attorney, Agent, or Firm* — Harrity & Harrity, LLP

(57) ABSTRACT

Implementations described herein relate to a mixed write cursor for block stripe writing. In some implementations, a memory system may include one or more components that are configured to construct a block stripe associated with a write cursor, where the block stripe is associated with memory blocks from respective memory dies of a set of memory dies. The one or more components may be configured to program the first data to a first one or more memory blocks of the block stripe following a first logical write direction associated a logical order of the set of memory dies. The one or more components may be configured to program the second data to a second one or more memory blocks of the block stripe following a second logical write direction associated with the logical order of the set of memory dies.

25 Claims, 10 Drawing Sheets

MIXED WRITE CURSOR FOR BLOCK STRIPE WRITING

CROSS-REFERENCE TO RELATED APPLICATION

This patent application claims priority to Chinese Patent Application No. 202210999361.6, filed on Aug. 19, 2022, entitled "MIXED WRITE CURSOR FOR BLOCK STRIPE WRITING," which is hereby expressly incorporated by reference herein.

TECHNICAL FIELD

The present disclosure generally relates to memory devices, memory device operations, and, for example, to a mixed write cursor for block stripe writing.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, the electronic device may write to, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), holographic RAM (HRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source.

A non-volatile memory device, such as a NAND memory device, may use circuitry to enable electrically programming, erasing, and storing of data even when a power source is not supplied. Non-volatile memory devices may be used in various types of electronic devices, such as computers, mobile phones, or automobile computing systems, among other examples. A non-volatile memory device may include an array of memory cells, a page buffer, and a column decoder. In addition, the non-volatile memory device may include a control logic unit (e.g., a controller), a row decoder, or an address buffer, among other examples. The memory cell array may include memory cell strings connected to bit lines, which are extended in a column direction.

A memory cell, which may be referred to as a "cell" or a "data cell," of a non-volatile memory device may include a current path formed between a source and a drain on a semiconductor substrate. The memory cell may further include a floating gate and a control gate formed between insulating layers on the semiconductor substrate. A programming operation (sometimes called a write operation) of the memory cell is generally accomplished by grounding the source and the drain areas of the memory cell and the semiconductor substrate of a bulk area, and applying a high positive voltage, which may be referred to as a "program voltage," a "programming power voltage," or "VPP," to a control gate to generate Fowler-Nordheim tunneling (referred to as "F-N tunneling") between a floating gate and the semiconductor substrate. When F-N tunneling is occurring, electrons of the bulk area are accumulated on the floating gate by an electric field of VPP applied to the control gate to increase a threshold voltage of the memory cell.

An erasing operation of the memory cell is concurrently performed in units of sectors sharing the bulk area (referred to as "blocks"), by applying a high negative voltage, which may be referred to as an "erase voltage" or "Vera," to the control gate and a configured voltage to the bulk area to generate the F-N tunneling. In this case, electrons accumulated on the floating gate are discharged into the source area, so that the memory cells have an erasing threshold voltage distribution.

Each memory cell string may have a plurality of floating gate type memory cells serially connected to each other. Access lines (sometimes called "word lines") are extended in a row direction, and a control gate of each memory cell is connected to a corresponding access line. A non-volatile memory device may include a plurality of page buffers connected between the bit lines and the column decoder. The column decoder is connected between the page buffer and data lines.

DETAILED DESCRIPTION

Figure 1:
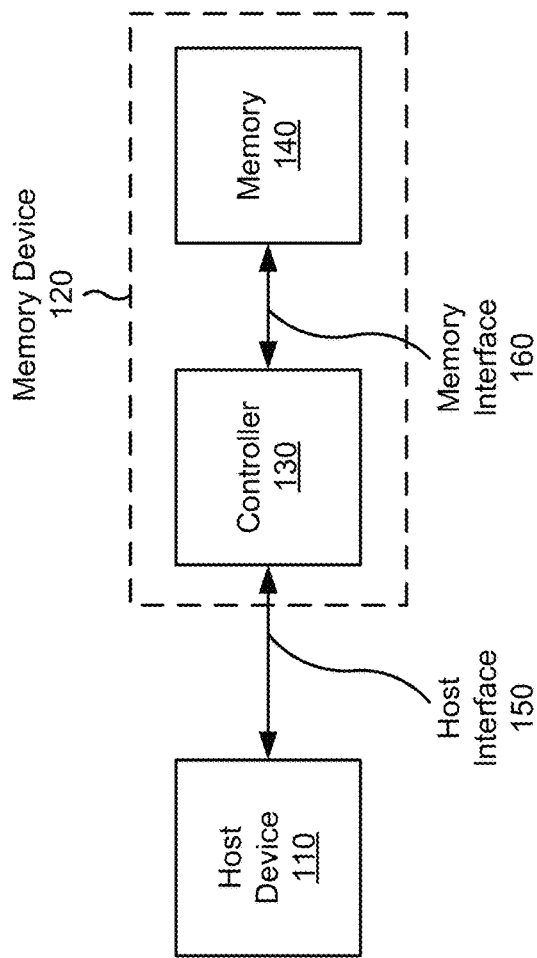
FIG. 1 is a diagram illustrating an example system capable of performing a write operation using a mixed write cursor for block stripe writing.

In some cases, a memory device may perform different types of random write operations. For example, the memory device may write data that is obtained from a host device (e.g., referred to herein as "host writes," "host write data" as part of a host write operation. As another example, the memory device may write data associated with a garbage collection operation. In some examples, the memory device may produce free memory blocks using a technique referred to as "garbage collection." Garbage collection may include reclaiming (e.g., erasing and making available for writing) memory blocks that have the most invalid pages. As another example, garbage collection may include reclaiming memory blocks with more than a threshold quantity of invalid pages. If sufficient free blocks exist for a writing operation, then a garbage collection operation may not occur. An invalid page, for example, can be a page of data that has been updated to a different page. In other words, garbage collection is an operation to manage memory utilization in a flash memory. When the free physical space in a flash memory gets low, a garbage collection operation may enable the memory device to recover free space to allow for new host data to be written. The garbage collection operation may include writing (e.g., re-writing) data from valid pages from a first block (e.g., a victim block or a source block) to a second block (e.g., a destination block) (e.g., which may be referred to as "folding" the data from the first block to the second block).

Typically, the memory device may separately perform a host write operation and a garbage collection write operation. A consideration for separately performing the host write operation and the garbage collection write operation may include an anticipated retention time (e.g., which may also be referred to as a "temperature") of the respective data associated with the different write operations. For example, data may be categorized as "hot" data or "cold" data (and/or "warm" data in some examples). Hot data may include short-living data which is likely to be overwritten (or re-written) within a relatively short period of time (e.g., a period of time less than a pre-defined low threshold), while cold data may include static data which is not likely to be overwritten for a relatively long period of time (e.g., a period of time greater than a pre-defined high threshold). In some cases, the host write data may be associated with hot data, whereas the garbage collection write operation may be associated with cold data to improve an efficiency of the garbage collection operation. For example, if the host write operation and the garbage collection write operation are not separated, this may result in the garbage collection operation folding, or re-writing, hot data that is likely to be overwritten (or invalidated) in a short period of time, thereby reducing an efficiency of the garbage collection operation.

For example, the memory device may use two separate write cursors for the host write operation and the garbage collection write operation. As used herein, a "write cursor" may refer to a pointer to an open block (or block stripe) in which a data stream is being programmed into a physical location for the type of data stream. For example, a write cursor may be used to abstract a data layout and write ordering of a write operation. As used herein, a "block stripe" may refer to a set of blocks organized together for various read, write, erase, and/or garbage collection purposes. For example, a block stripe may include one or more blocks associated with different memory units (e.g., different memory dies) of the memory device. In some examples, a block stripe may be associated with, or defined by, a write cursor (e.g., for a write operation). The memory device may construct a first block stripe (e.g., associated with a first write cursor) for the host write operation. The memory device may construct a second block stripe (e.g., associated with a second write cursor) for the garbage collection write operation (e.g., as depicted and described in more detail in connection with FIG. 5).

During a random write workload, mixed write data associated with different operations (e.g., host write vs. garbage collection write) may arrive at the memory device (e.g., at a NAND interface of the memory device). Because of the mixed write data, the memory device may need to switch between writing to a first block stripe (e.g., to program host data) and writing to a second block stripe (e.g., to program garbage collection data). This block stripe switching during a write operation may reduce the performance of the memory device. For example, block stripe switching may introduce one or more limitations for the write operation. For example, certain procedure and/or operations may not be performed when the memory device is switching between block stripes for a write operation. As an example, the memory device may not perform a dynamic word line start voltage operation (e.g., that may reduce a page programming time (tProg) associated with the write operation). As a result, the performance of the memory device may be reduced because the memory device may not realize the benefits of certain procedures and/or operations that may not be performed when the memory device is switching between block stripes for the write operation.

As another example, the memory device may reserve one or more block stripes for each write cursor used by the memory device. As a result, using multiple write cursors for a write operation may consume additional memory resources associated with the reserved block stripes for respective write cursors. For example, one or more block stripes may need to be reserved for each write cursor because blocks may only be written after the blocks have been erased. If a block to be programmed with write data is not erased, the memory device may need to wait to perform the write operation until the block is erased. This may introduce latency associated with the write operation. Therefore, the memory device may erase blocks of the reserved block stripes to reduce the latency of the write operation. Additionally, some erase operations that improve a quality of service (QoS) or performance of erase operations (such as a slice erase operation where blocks from different memory dies are erased one after each other) may increase an overhead and/or time associated with the erase operations, thereby resulting in additional block stripes needed to be reserved for each write cursor. Further, to decrease a likelihood of a scenario in which the memory device experiences an error associated with programming a block stripe and no reserved block stripes are available to be written, more than one block stripe may be reserved for each write cursor. In other words, using multiple block stripes and/or multiple write cursors for a random write operation may result in an increase in a quantity of blocks stripes that are reserved for the random write operation.

Reserving additional block stripes may decrease over provisioning (e.g., a function that provides additional capacity specifically for data to be erased from a flash memory, without interrupting system performance) of the memory device. Over provisioning may contribute to improving performance of the memory device as well as prolonging a life expectancy of physical memory units of the memory device. Therefore, by decreasing the over provisioning by increasing a quantity of blocks stripes reserved for the write operation, a performance and/or lifespan of the memory device may be reduced.

Some implementations described herein enable a mixed write cursor for block stripe writing. For example, the memory device may construct a single block stripe (e.g., associated with a single write cursor) for a host write operation and a garbage collection write operation. The memory device may program first data (e.g., associated with host write data) to a first one or more memory blocks of the block stripe following a first logical write direction (e.g., a first write direction) associated a logical order of a set of memory dies associated with the block stripe. The memory device may program second data (e.g., garbage collection data) to a second one or more memory blocks of the block stripe following a second logical write direction (e.g., a second write direction) associated with the logical order of the set of memory dies. In other words, the memory device may use a single write cursor for the host write operation and the garbage collection operation. Additionally, the memory device may use different write directions for the host write operation and the garbage collection write operation when writing to the single block stripe.

As a result, a performance of the memory device and/or the write operation may be improved. For example, because a single write cursor and/or block stripe is used for both the host write operation and the garbage collection write operation, a quantity of reserved block stripes for the write operation may be reduced. This may increase over provisioning for the memory device, thereby improving a performance of the memory device. Additionally, because only a single write cursor is used, a likelihood of an error associated with the write operation may be reduced (e.g., because using more write cursors may increase a likelihood of an error because the more write cursors used, the higher likelihood of an error with at least one or the write cursors).

Further, because only single write cursor and/or block stripe is used for both the host write operation and the garbage collection write operation, the memory device may be enabled to perform certain techniques and/or operations that are not available when block stripe switching is performed. For example, the memory device may be enabled to perform a dynamic word line start voltage operation because only a single block stripe is used, thereby reducing a page programming time (tProg) associated with the write operation. As another example, using different write directions associated with the host write operation and the garbage collection write operation may improve a likelihood that host write data and garbage collection data are written to different blocks included in the block stripe (e.g., thereby separating hot data and cold data into different blocks and improving an efficiency of the garbage collection operation).

FIG. 1 is a diagram illustrating an example system 100 capable of performing a write operation using a mixed write cursor for block stripe writing. The system 100 may include one or more devices, apparatuses, and/or components for performing operations described herein. For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, a device in a data center, a device in a cloud computing environment, a vehicle (e.g., an automobile or an airplane), and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

The memory device 120 may be any electronic device configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device. In this case, the memory 140 may include non-volatile memory configured to maintain stored data after the memory device 120 is powered off. For example, the memory 140 may include NAND memory or NOR memory. In some implementations, the memory 140 may include volatile memory that requires power to maintain stored data and that loses stored data after the memory device 120 is powered off, such as one or more latches and/or random-access memory (RAM), such as dynamic RAM (DRAM) and/or static RAM (SRAM). For example, the volatile memory may cache data read from or to be written to non-volatile memory, and/or may cache instructions to be executed by the controller 130.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include a memory controller, a system controller, an ASIC, an FPGA, a processor, a microcontroller, and/or one or more processing components. In some implementations, the controller 130 may be a high-level controller, which may communicate directly with the host device 110 and may instruct one or more low-level controllers regarding memory operations to be performed in connection with the memory 140. In some implementations, the controller 130 may be a low-level controller, which may receive instructions regarding memory operations from a high-level controller that interfaces directly with the host device 110. As an example, a high-level controller may be an SSD controller, and a low-level controller may be a non-volatile memory controller (e.g., a NAND controller) or a volatile memory controller (e.g., a DRAM controller). In some implementations, a set of operations described herein as being performed by the controller 130 may be performed by a single controller (e.g., the entire set of operations may be performed by a single high-level controller or a single low-level controller). Alternatively, a set of operations described herein as being performed by the controller 130 may be performed by more than one controller (e.g., a first subset of the operations may be performed by a high-level controller and a second subset of the operations may be performed by a low-level controller).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, the memory device 120 and/or the controller 130 may be configured to construct and/or program a block stripe (e.g., associated with a write cursor) for both a host write operation (e.g., associated with data received from the host device 110) and a garbage collection write operation. For example, the memory device 120 and/or the controller 130 may be configured to write first data associated with the host write operation to the block stripe using a first write direction. The memory device 120 and/or the controller 130 may be configured to write second data associated with the garbage collection write operation to the block stripe using a second write direction.

As indicated above, FIG. 1 is provided as an example. Other examples may differ from what is described with regard to FIG. 1.

Figure 2:
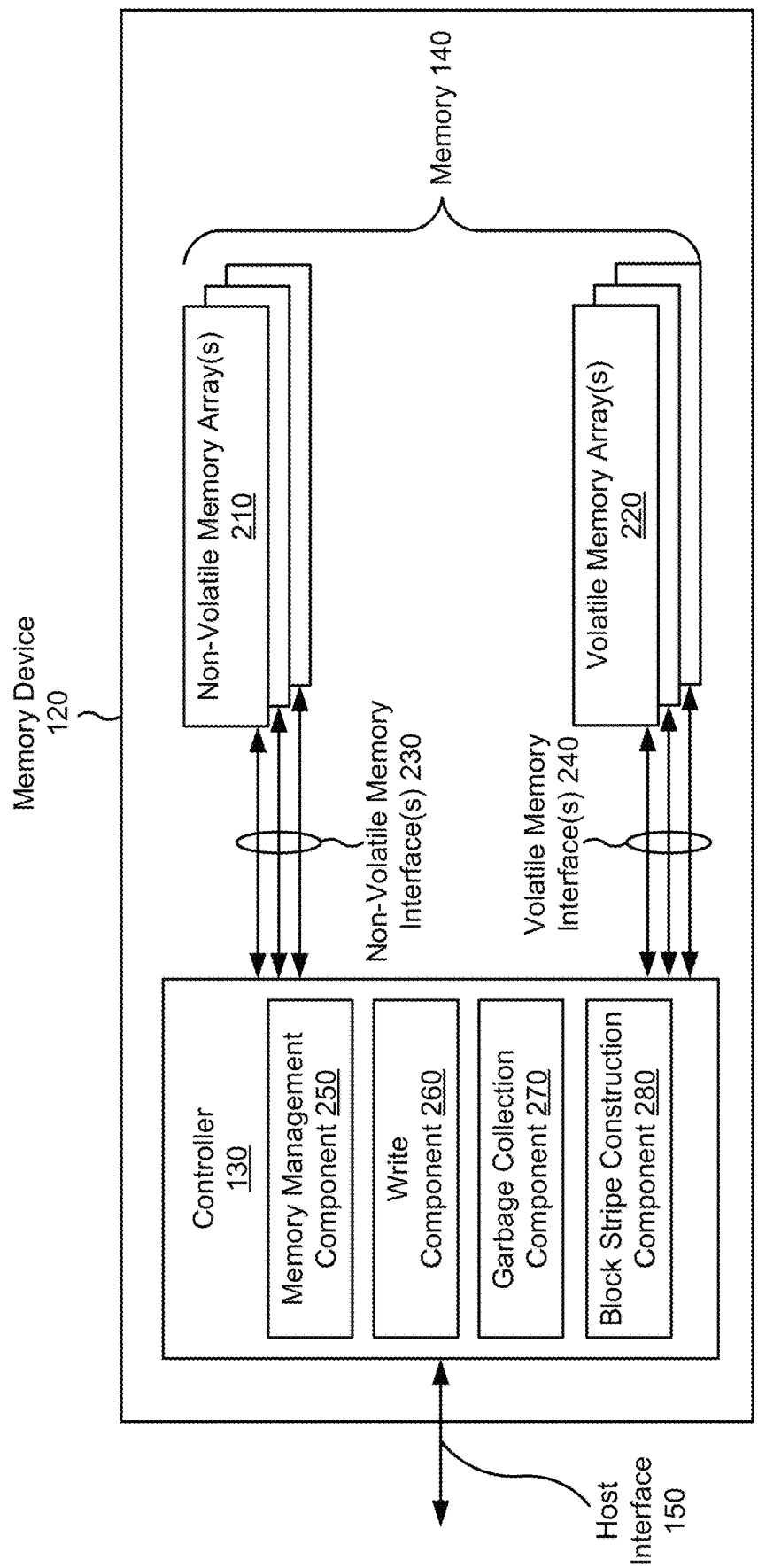
FIG. 2 is a diagram of example components included in a memory device.

FIG. 2 is a diagram of example components included in a memory device 120. As described above in connection with FIG. 1, the memory device 120 may include a controller 130 and memory 140. As shown in FIG. 2, the memory 140 may include one or more non-volatile memory arrays 210, such as one or more NAND memory arrays and/or one or more NOR memory arrays. Additionally, or alternatively, the memory 140 may include one or more volatile memory arrays 220, such as one or more SRAM arrays and/or one or more DRAM arrays. The controller 130 may transmit signals to and receive signals from a non-volatile memory array 210 using a non-volatile memory interface 230. The controller 130 may transmit signals to and receive signals from a volatile memory array 220 using a volatile memory interface 240.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface 150, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 250, a write component 260, a garbage collection component 270, and/or a block stripe construction component 280. In some implementations, one or more of these components are implemented as one or more instructions (e.g., firmware) executed by the controller 130. Alternatively, one or more of these components may be implemented as dedicated integrated circuits distinct from the controller 130.

The memory management component 250 may be configured to manage performance of the memory device 120. For example, the memory management component 250 may perform wear leveling, bad block management, block retirement, read disturb management, garbage collection operations, and/or other memory management operations. In some implementations, the memory device 120 may store (e.g., in memory 140) one or more memory management tables. A memory management table may store information that may be used by or updated by the memory management component 250, such as information regarding memory block age, memory block erase count, and/or error information associated with a memory partition (e.g., a memory cell, a row of memory, a block of memory, or the like).

The write component 260 may be configured to manage write operations of the memory device 120. For example, the write component 260 may perform host write operations, garbage collection write operations, and/or other write operations described herein. For example, the write component 260 may be configured to cause the controller 130 to provide commands (e.g., via the non-volatile memory interface(s) 230 and/or the volatile memory interface(s) 240) to cause data to be programmed and/or written to a memory array (e.g., the non-volatile memory array(s) 210 and/or the volatile memory array(s) 220). As an example, the write component 260 may be configured to write host data and garbage collection data to a single block stripe, as described in more detail elsewhere herein.

The garbage collection component 270 may be configured to manage garbage collection operations of the memory device 120. For example, the garbage collection component 270 may be configured to identify blocks, or block stripes, having a valid page count or a valid translate unit (TU) count that satisfies a threshold. The garbage collection component 270 may be configured to identify valid data from the identified blocks or block stripes that is to be written or folded to new blocks or block stripes (e.g., by the write component 260 and/or the memory management component 250). The garbage collection component 270 may be configured to perform one or more operations associated with the garbage collection operation, as described in more detail elsewhere herein (such as in connection with FIG. 4).

The block stripe construction component 280 may be configured to construct or form a block stripe. For example, the block stripe construction component 280 may be configured to identify one or more blocks from a set of memory dies (e.g., associated with the memory array(s) of the memory device 120) that are to be included in a block stripe. The block stripe construction component 280 may be configured to store an indication of the blocks included in the constructed block stripe. In some implementations, the block stripe construction component 280 may be configured to construct a victim block stripe for a garbage collection operation, as described in more detail elsewhere herein.

Figure 8:
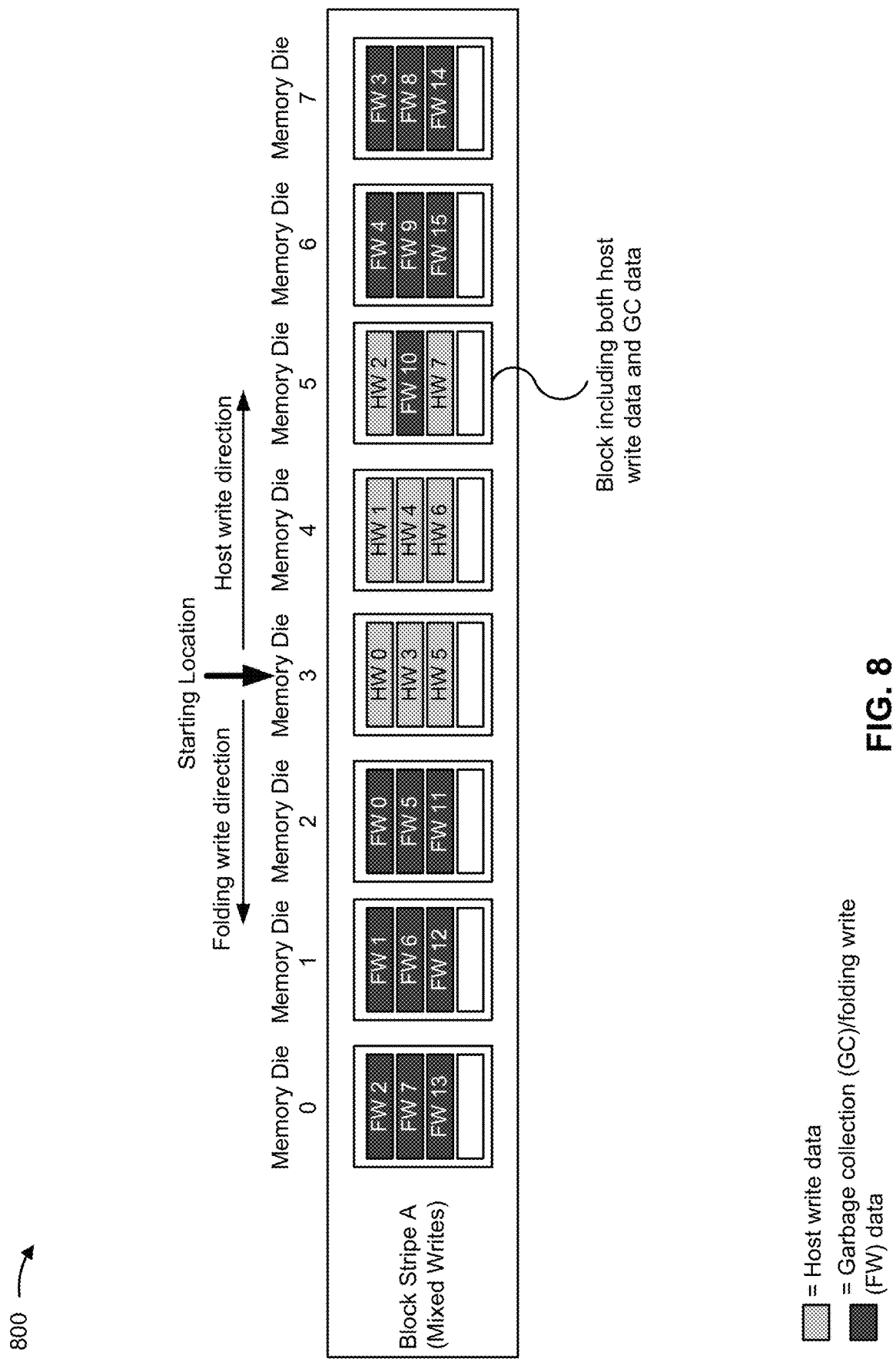
FIG. 8 is a diagram illustrating an example block stripe associated with a mixed write cursor.
Figure 9:
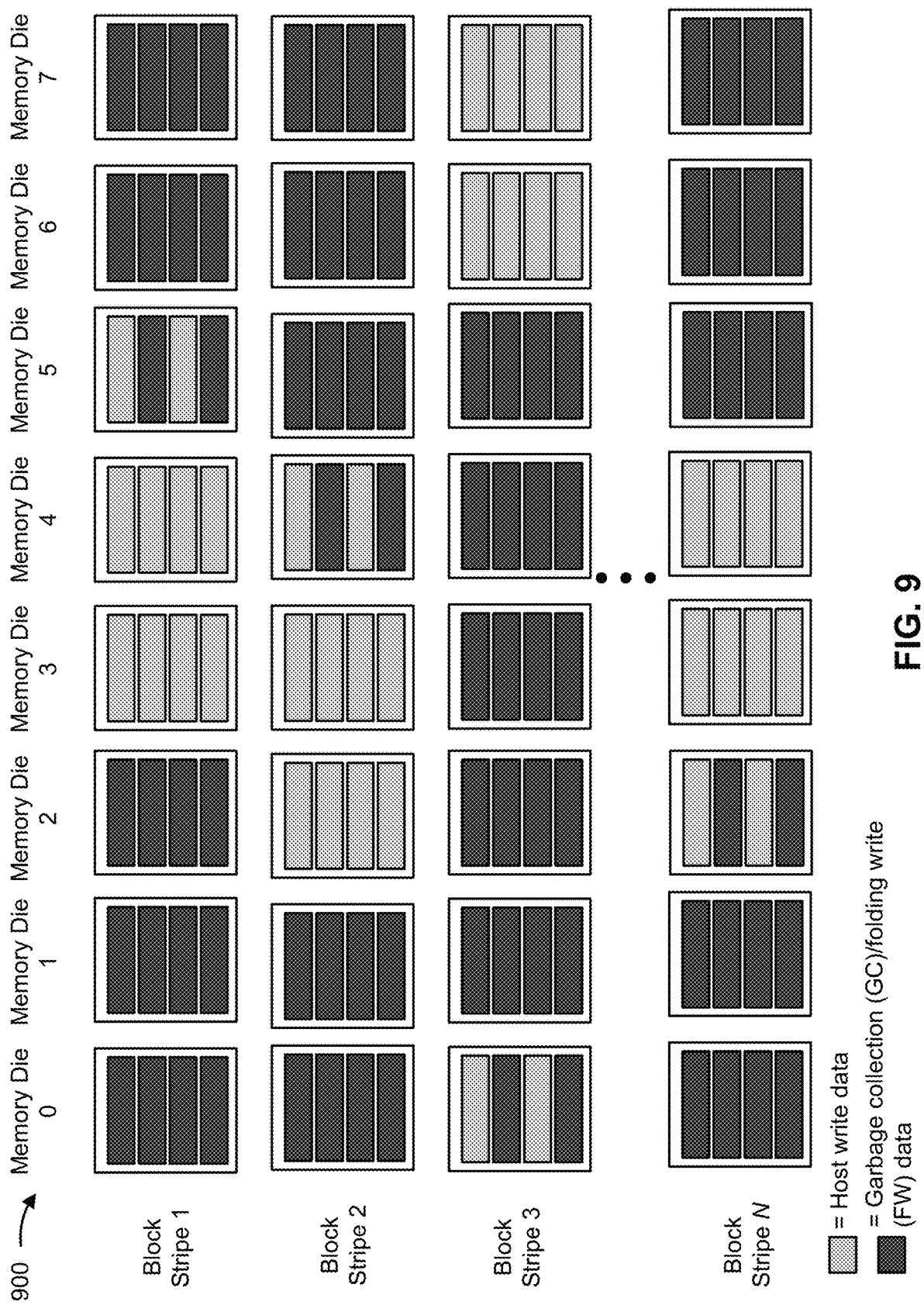
FIG. 9 is a diagram illustrating example block stripes associated with mixed write cursors.
Figure 10:
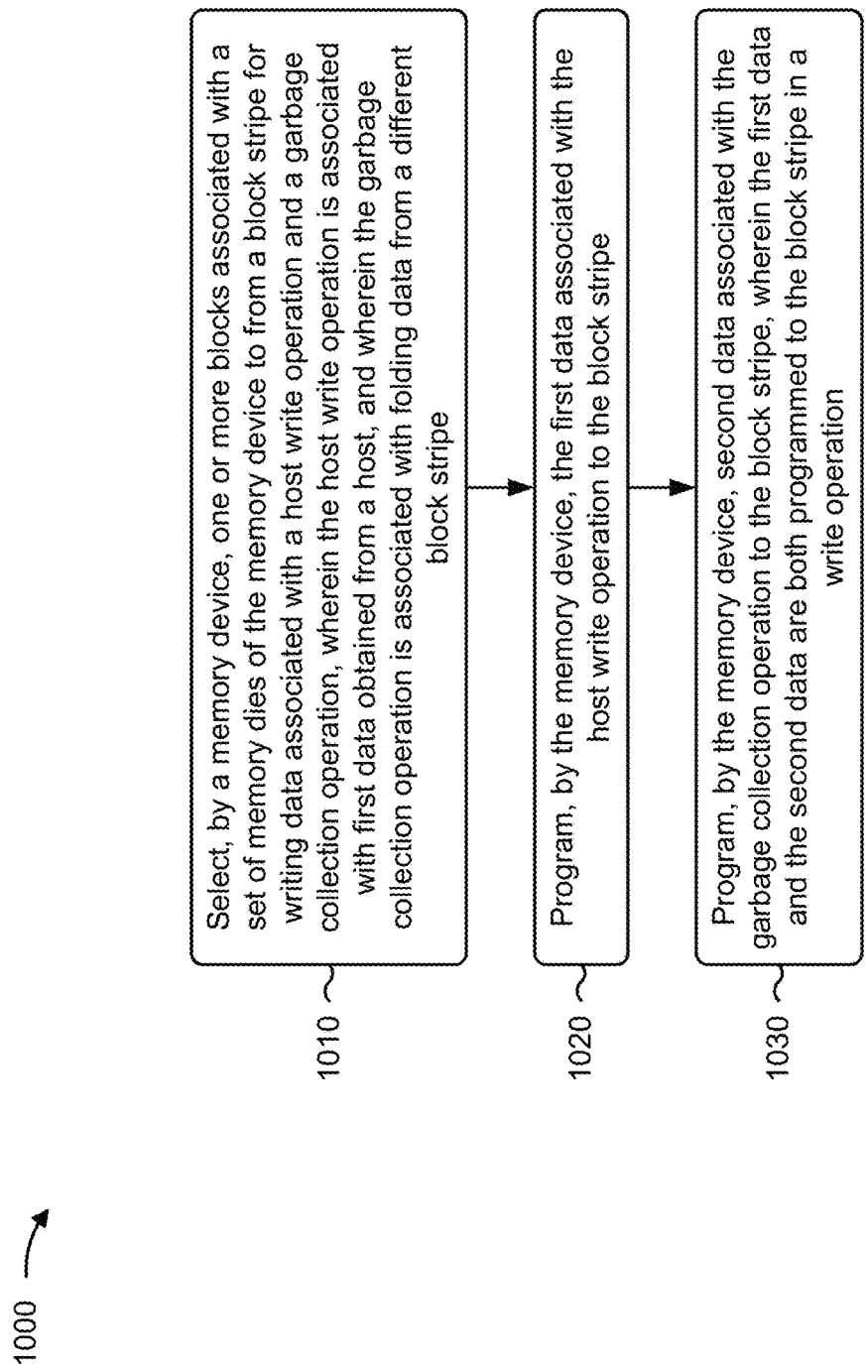
FIG. 10 is a flowchart of an example method associated with a mixed write cursor for block stripe writing.

One or more devices or components shown in FIG. 2 may be configured to perform operations described elsewhere herein, such as one or more operations of FIGS. 6-9 and/or one or more process blocks of the methods of FIG. 10. For example, the controller 130 and/or the write component 260 may be configured to perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

Figure 3:
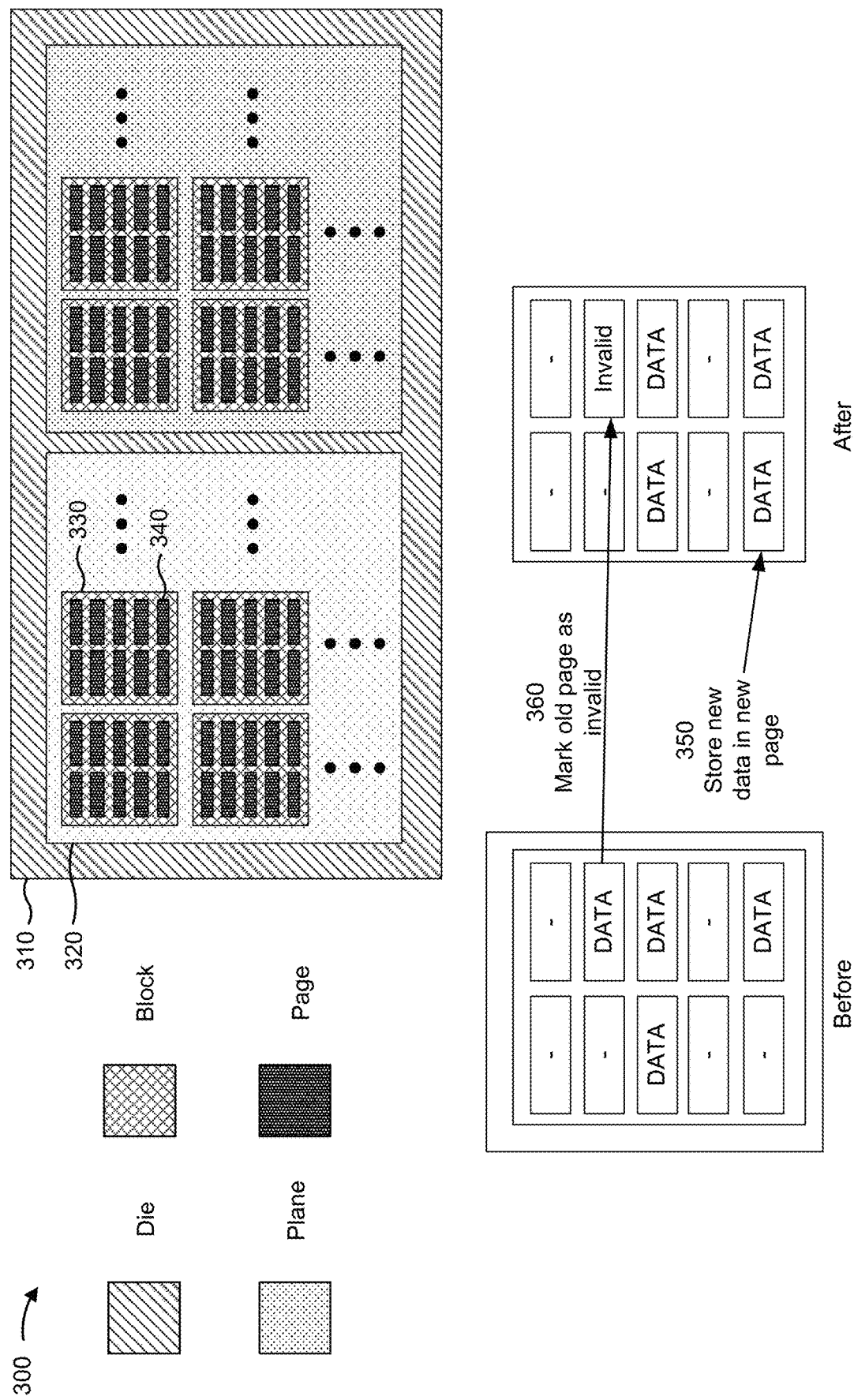
FIG. 3 is a diagram illustrating an example memory architecture that may be used by the memory device.

FIG. 3 is a diagram illustrating an example memory architecture 300 that may be used by the memory device 120. The memory device 120 may use the memory architecture 300 to store data. As shown, the memory architecture 300 may include a die 310, which may include multiple planes 320. A plane 320 may include multiple blocks 330. A block 330 may include multiple pages 340. Although FIG. 3 shows a particular quantity of planes 320 per die 310, a particular quantity of blocks 330 per plane 320, and a particular quantity of pages 340 per block 330, these quantities may be different than what is shown. In some implementations, the memory architecture 300 is a NAND memory architecture.

The die 310 is a structure made of semiconductor material, such as silicon. The memory device 120 may be fabricated on the die 310 (e.g., via a semiconductor device fabrication process). In some implementations, a die 310 is the smallest unit of memory that can independently execute commands. A memory chip or package may include one or more dies 310. In some implementations, a controller 130 may be configured to manage operations executed by multiple dies 310. For example, the controller 130 may be configured to manage operations for a memory system or a memory sub-system that includes multiple dies 310.

Each die 310 of a chip includes one or more planes 320. A plane 320 is sometimes called a memory plane. In some implementations, identical and concurrent operations can be performed on multiple planes 320 (sometimes with restrictions). Each plane 320 includes multiple blocks 330. A block 330 is sometimes called a memory block. Each block 330 includes multiple pages 340. A page 340 is sometimes called a memory page. A block 330 is the smallest unit of memory that can be erased. In other words, an individual page 340 of a block 330 cannot be erased without erasing every other page 340 of the block 330. A page 340 is the smallest unit of memory to which data can be written (i.e., the smallest unit of memory that can be programmed with data). The terminology "programming" memory and "writing to" memory may be used interchangeably. A page 340 may include multiple memory cells that are accessible via the same access line (sometimes called a word line).

In some implementations, read and write operations are performed for a specific page 340, while erase operations are performed for a block 330 (e.g., all pages 340 in the block 330). In some implementations, to prevent wearing out of memory, all pages 340 of a block 330 may be programmed before the block 330 is erased to enable a new program operation to be performed to a page 340 of the block 330. After a page 340 is programmed with data (called "old data" or "stale data" below), that data can be erased, but that data cannot be overwritten with new data prior to being erased. The erase operation would erase all pages 340 in the block 330, and erasing the entire block 330 every time that new data is to replace old data would quickly wear out the memory cells of the block 330. Thus, rather than performing an erase operation, the new data may be stored in a new page (e.g., an empty page), as shown by reference number 350, and the old page that stores the old data may be marked as invalid, as shown by reference number 360 (e.g., as part of a garbage collection operation). The memory device 120 may then point operations associated with the data to the new page and may track invalid pages to prevent program operations from being performed on invalid pages prior to an erase operation. When the pages 340 of a block 330 are full (e.g., all or some threshold quantity of pages are either invalid or store valid data), the memory device 120 may copy the valid data (e.g., to a new block or to the same block after erasure) and may erase the block 330.

As indicated above, FIG. 3 is provided as an example. Other examples may differ from what is described with regard to FIG. 3.

Figure 4:
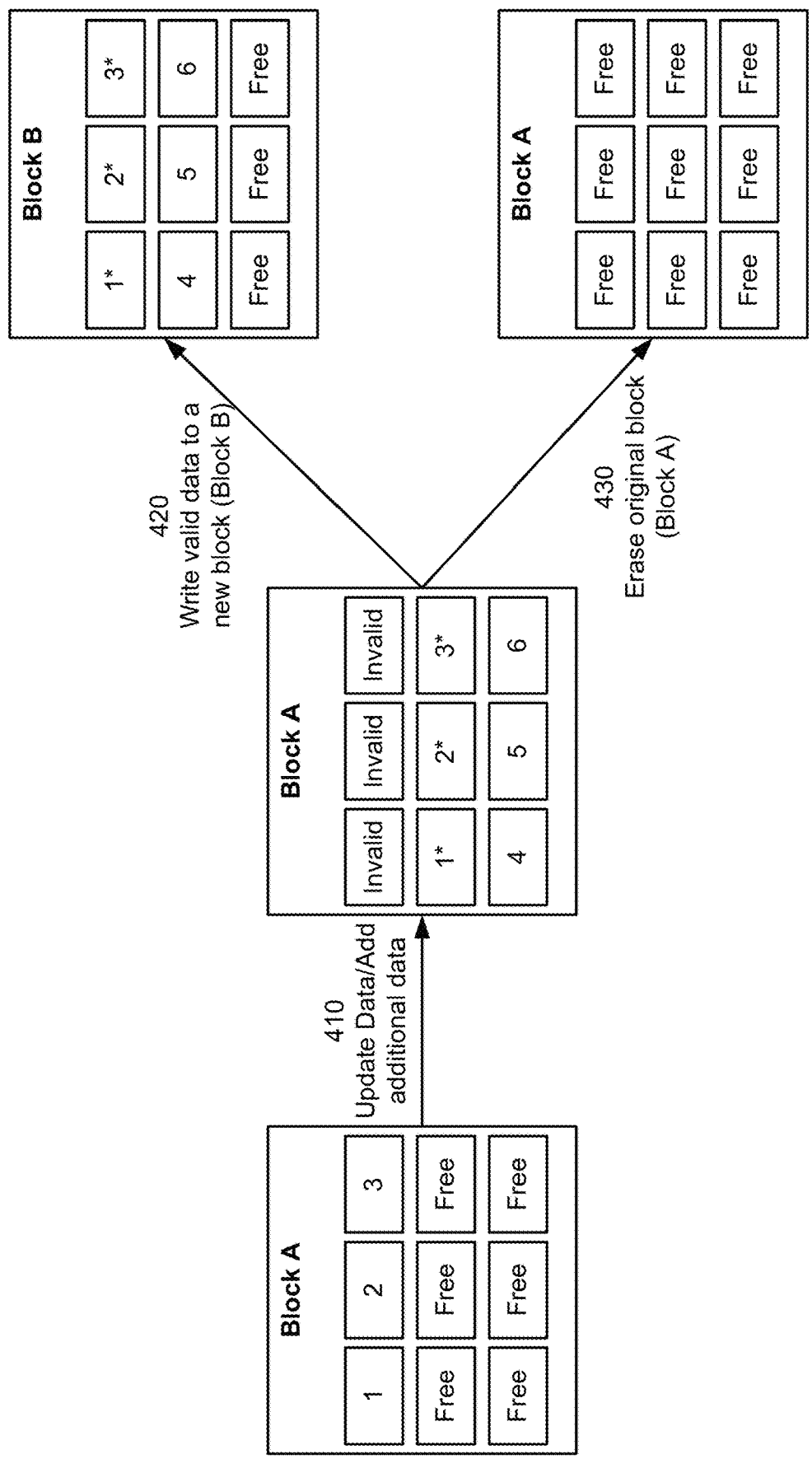
FIG. 4 is a diagram illustrating an example of a garbage collection operation.

FIG. 4 is a diagram illustrating an example of a garbage collection operation. Garbage collection may be a function or operation of the memory device 120 associated with reclaiming memory that is no longer in use. For example, the memory device 120 (e.g., the controller 130, the memory management component 250, and/or garbage collection component 270) may perform one or more operations described herein to reclaim memory which was previously allocated by the memory device 120, but is no longer referenced or valid.

For example, as shown in FIG. 4, a block (e.g., block A) may be associated with a set of pages (e.g., as described above in connection with FIG. 4). As shown, one or more pages of the block A may be associated with valid data (e.g., shown as page 1, page 2, and page 3). Other pages of the block A may not have data written to them and/or may be free (e.g., shown as "free" in FIG. 4). In a first operation 410, the memory device may update data (e.g., re-write data) that is stored by the block A and/or may write new (or additional) data to the block A. For example, the memory device 120 may re-write the data stored in page 1, page 2, and page 3 to different pages of the Block A (e.g., shown as page 1*, page 2*, and page 3* in FIG. 4). The memory device 120 may mark the pages that previously stored the now re-written data as invalid. For example, as described above, erase operations may be performed at the block level (e.g., individual pages may not be erased), therefore, when data is re-written or updated, the pages that store the now stale data may be marked as invalid by the memory device 120. Additionally, the memory device 120 may receive additional data (e.g., from the host device 110) to be written. The memory device 120 may write the additional data to other pages of the block A (e.g., shown as page 4, page 5, and page 6).

As shown in FIG. 4, after the re-writing of previously stored data and/or the writing of additional data to the block A, all pages of the block A may store data (e.g., the block A may be full). However, as described above, some pages of the block A may store stale or invalid data. Therefore, the memory device 120 may perform a garbage collection operation to reclaim memory which is allocated to stale or invalid data and to preserve the valid data stored by the block A. In some implementations, a given block may be associated with a valid page count or a valid TU count indicating a quantity of pages of the given block that store valid data. In some implementations, the memory device 120 may select a block (e.g., the block A) to be associated with the garbage collection operation based on the valid page count or the valid TU count of the block satisfying a threshold. As another example, the memory device 120 may select a block (e.g., the block A) to be associated with the garbage collection operation based on the block being associated with the most invalid pages or the lowest valid page count or valid TU count among a set of blocks.

In a second operation 420, the memory device 120 may write valid data stored in the block A to a different block (e.g., block B). For example, as shown in FIG. 4, the data stored by the page 1*, page 2*, and page 3*, page 4, page 5, and page 6 of the block A may be written to, or folded to, respective pages of the block B (e.g., this may referred to as a garbage collection write operation or a folding write operation). In such examples, the block A may be referred to as a victim block for the garbage collection operation. The memory device 120 may update an address (e.g., a logical block address (LBA)) of the data that is written to the block B (e.g., indicating an updated physical location where the data is stored).

In a third operation 430, the memory device 120 may perform an erase operation to erase data stored by the block A (e.g., after writing or folding the valid data to the block B). As a result, the block A may be erased, and all pages of the block A may be available to be written. This may enable the memory device to reclaim memory that was previously used to store stale or invalid data and to preserve valid data stored by the memory device 120. This may improve a performance of the memory device 120 and/or may increase a lifespan of the memory device 120.

As indicated above, FIG. 4 is provided as an example. Other examples may differ from what is described with regard to FIG. 4.

Figure 5:
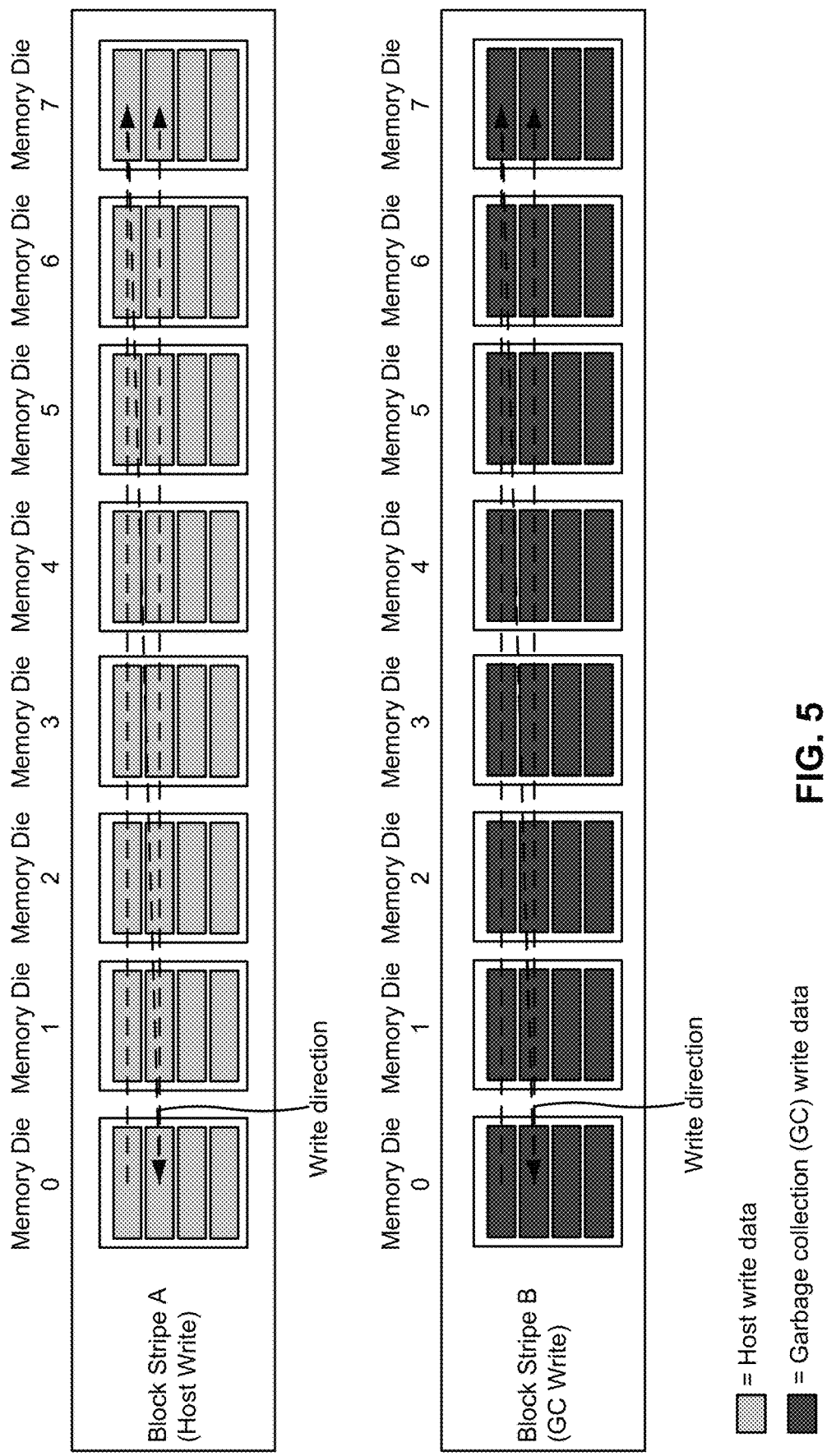
FIG. 5 is a diagram illustrating an example of performing a host write operation and a garbage collection write operation.

FIG. 5 is a diagram illustrating an example of performing a host write operation and a garbage collection write operation. A memory system (e.g., including one or more memory devices 120), and/or a memory device 120, may be associated with a set of memory dies (e.g., a set of dies 310). As described in more detail in connection with FIG. 3, each die may be associated with a set of blocks. As shown in FIG. 5, the memory device 120 and/or the memory system may perform a host write operation using a first block stripe (e.g., block stripe A) and may perform a garbage collection write operation using a second block stripe (e.g., block stripe B).

As described elsewhere herein, a block stripe may refer to a set of blocks organized together for various read, write, erase, and/or garbage collection purposes, among other examples. For example, the memory device 120 and/or the memory system (e.g., the block stripe construction component 280) may select one or more blocks from respective dies of the memory device 120 and/or the memory system to be included in a given block stripe. In some implementations, a single block from each die may be selected to be included in the block stripe. For example, each die may select a block to be included in the block stripe. The controller 130 may associate or map a write cursor to a block stripe to point to a location or a block stripe associated with a given write operation. In other words, a block stripe may be associated with a write cursor.

In some examples, a block stripe may be a redundant array of independent NAND (RAIN) stripe or a redundant array of independent disks (RAID) stripe. RAIN and RAID may be used interchangeably herein. For example, a conventional memory system may utilize a redundancy operation when storing data at the memory components of the memory system. For example, a RAIN operation can be implemented to provide redundancy for the data stored at the memory system. The redundancy operation can protect the data against a failure at the memory system by storing data in a stripe (hereinafter also referred to as "RAIN stripe") across multiple memory components (i.e., dies). A RAIN stripe can refer to a group of memory blocks or user data elements that are associated with a single parity data. For example, as data is received by the memory system, the data can be stored as blocks across multiple memory components (e.g., across multiple dies). A parity data can also be generated for the data that is stored across the memory components. The parity data may be generated based on an exclusive-or (XOR) operation with the received data and can be used to reconstruct or recalculate the user data of the RAIN stripe in the event of a failure at the memory system. For example, if any data stored at a particular memory component fails, the parity data may be combined with the remaining user data to reconstruct the data at the failed memory component. Thus, data and a corresponding parity data can be stored across multiple memory components or dies of the memory system.

As described elsewhere herein, the memory device 120 and/or the memory system may use different block stripes and/or write cursors for performing the host write operation and the garbage collection write operation. For example, the memory device 120 and/or the memory system may construct the block stripe A for the host write operation (e.g., for writing data received from a host device 110) and may construct the block stripe B for the garbage collection write operation (e.g., for folding valid data stored by victim blocks or victim block stripes associated with a garbage collection operation).

Host write data may be written to the block stripe A by the memory device 120 and/or the memory system. For example, the memory device 120 and/or the memory system may program host write data following a "Z" pattern, where the memory device 120 and/or the memory system writes data to a first page (e.g., having a first page index) of a block associated with a first die (e.g., memory die 0), followed by writing data to a first page (e.g., having the first page index) of a block associated with a second die (e.g., memory die 1), followed by writing data to a first page (e.g., having the first page index) of a block associated with a third die (e.g., memory die 2), and so on. Once a first page (e.g., having the first page index) of a block of a last die (e.g., memory die 7) associated with the block stripe A is written to, the memory device 120 and/or the memory system writes data to a second page (e.g., having a second page index) of the block associated with the first die (e.g., memory die 0). The memory device 120 and/or the memory system may continue to write data to the block stripe A following this pattern. Similarly, garbage collection write data (e.g., valid data from other blocks) may be written to the block stripe B. For example, the memory device 120 and/or the memory system may write garbage collection write data to the block stripe B following a "Z" pattern in a similar manner as described above.

In a random write workload, data may unpredictably arrive at the memory device 120 and/or the memory system. For example, when the memory device 120 and/or the memory system has host data to write, the memory device 120 and/or the memory system may use the block stripe A to write the host data. When the memory device 120 and/or the memory system has garbage collection write data, the memory device 120 and/or the memory system may use the block stripe B to write the garbage collection write data. As a result, during the random write workload, the memory device 120 and/or the memory system may switch between writing to the block stripe A and writing to the block stripe B (e.g., referred to herein as "block stripe switching"). As described elsewhere herein, this may degrade a performance of the memory device 120 and/or the memory system because block stripe switching may restrict operations and techniques that can be performed and/or may increase an overhead of reserved block stripes associated with the write operation.

As indicated above, FIG. 5 is provided as an example. Other examples may differ from what is described with regard to FIG. 5.

Figure 6:
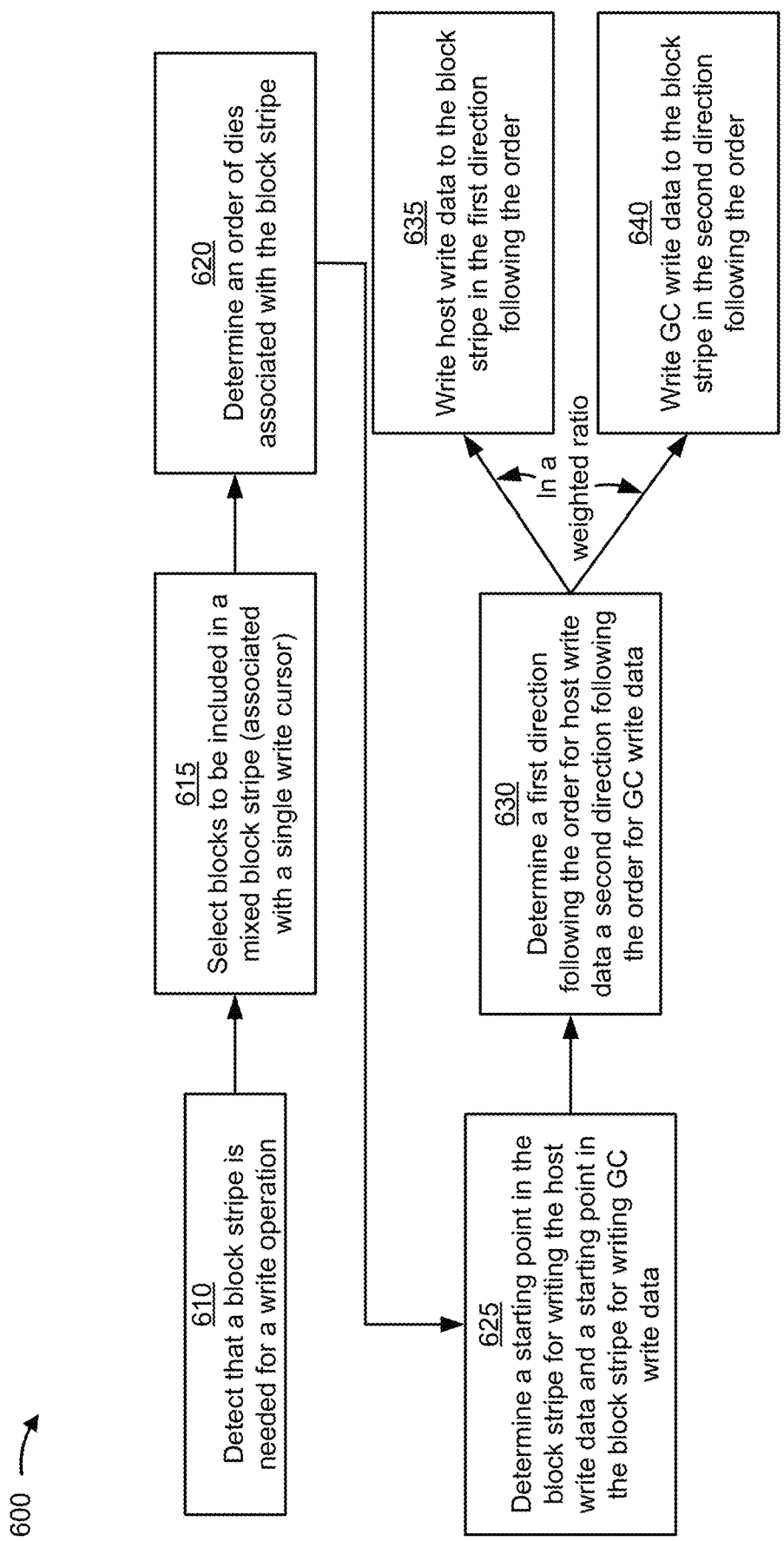
FIG. 6 is a diagram illustrating an example process associated with a mixed write cursor for block stripe writing.

FIG. 6 is a diagram illustrating an example process 600 associated with a mixed write cursor for block stripe writing. Functions and/or operations described herein associated with the example process 600 may be performed by the memory device 120, the controller 130, the memory management component 250, the write component 260, the garbage collection component 270, and/or the block stripe construction component 280.

In a first operation 610, the process 600 may include detecting that a block stripe is needed for a write operation. The write operation may include a host write operation and a garbage collection write operation (e.g., a folding write operation). For example, detecting that a block stripe is needed may include that a quantity of reserved blocks for a mixed write cursor does not satisfy a threshold. In some examples, detecting that the block stripe is needed may be based on detecting that all pages of a block stripe that is currently being written to have been used (e.g., have been written to or programmed with data). As used herein, "mixed write cursor" may refer to a write cursor that is associated with the write operation (e.g., that is associated with both the host write operation and the garbage collection write operation). In other words, a write cursor associated with the block stripe may be associated with programming data associated with a host write operation and with programming data associated with a garbage collection operation. For example, the write cursor may abstract a logical address location to be used for programming first data associated with a host write operation and with programming second data associated with a garbage collection operation.

Process 600 may include constructing a block stripe associated with the write cursor (e.g., the mixed write cursor based on detecting that the block stripe is needed for the write operation). For example, in a second operation 615, process 600 may include selecting one or more blocks associated with a set of memory dies of a memory device or memory system form a block stripe for writing data associated with the host write operation and the garbage collection operation. For example, the block stripe may be associated with memory blocks from respective memory dies of the set of memory dies.

In some implementations, the block stripe may be dynamically constructed. For example, rather than selecting pre-configured or the same blocks from each memory die (e.g., rather than selecting the same logical address of memory blocks from each memory die), process 600 may include dynamically selecting the memory blocks based on detecting that the block stripe is needed for at least one of the host write operation or the garbage collection operation. In some implementations, process 600 may include dynamically selecting the blocks included in the block stripe based on initiating the write operation.

In some implementations, the blocks to be included in the block stripe may be selected by each memory die (e.g., instructions may be executed on each memory die, where the instructions are configured to cause the memory die to dynamically select a block to be included in the block stripe). In some implementations, the blocks may be dynamically selected based on identifying blocks, from a set of blocks associated with a given memory die, that are free (e.g., that have been erased and/or that are not storing any data). For example, because block stripes may be associated with both host write data and garbage collection write data (e.g., as described in more detail elsewhere herein), blocks may be erased dynamically, as described in more detail elsewhere herein. For example, because a victim block stripe for the garbage collection operation may be dynamically constructed as part of the process 600, the blocks included in the block stripe (e.g., that is to be written to) may also be dynamically constructed such that blocks that are not erased and/or that contain valid data are not selected to be included in the block stripe. In other words, because the way victim blocks for the garbage collection operation are selected, the block stripe construct may not be static (e.g., following a pre-configured or static pattern). The block stripe may need to be dynamically constructed when a new block stripe is needed for the write operation (e.g., to avoid selecting blocks with valid data), such as when all pages of a last block stripe are used. This may improve an efficiency of the write operation and/or may reduce a latency that may otherwise have been introduced by selecting blocks with valid data to be included in the block stripe.

In some implementations, process 600 may include storing an indication of the one or more blocks included in the block stripe (e.g., storing an indication of the blocks that are dynamically selected to be included in the block stripe). For example, because the construction of the block stripe does not follow a pre-configured or static pattern, an indication of the blocks selected for each constructed block stripe may be stored (e.g., to enable the blocks include in the block stripe to be identified).

In some cases, storing the indication of the blocks included in the block stripe may be associated with a large memory overhead. For example, for a given block stripe, an indication of each block included in the block stripe may be stored. Additionally, indications for each block stripe constructed as part of the process 600 may be stored. Therefore, in some implementations, process 600 may include storing a single indication, of blocks that are included in the block stripe, associated with two or more memory dies, from the set of memory dies, which are logically coupled. In other words, two or more memory dies may be logically coupled for the purposes of storing indications of block(s) included in the block stripe. For example, for the purposes of storing the indication of the blocks included in the block stripe, a memory die 1 and a memory die 2 may be a coupled die (or virtual die) 1. As another example, a memory die 2 and a memory die 3 may be a coupled die (or virtual die) 2. A single indication for a couple die (or virtual die) may be stored. In other words, it may be assumed that each memory die associated with a couple die (or virtual die) has the same block (or block index) selected for the block stripe. For example, if an indication that a block 20 for the coupled die 1 is included in the block stripe, it may be assumed that a block 20 from the memory die 1 and a block 20 from the memory die 2 are included in the block stripe. This may conserve memory associated with storing the indication of the blocks included in the block stripe.

In a third operation 620, process 600 may include determining an order of dies (e.g., memory dies) associated with the block stripe. The order may be a logical order. For example, the order may be an order of logical identifiers or addresses associated with the dies. For example, the order may be from a lowest index value or address to a highest index value or address. For example, process 600 may include arranging (e.g., in a data structure) the memory blocks of the block stripe in an order corresponding to the logical order of the set of memory dies (e.g., as depicted in FIG. 8). This may enable the memory device 120 and/or the memory system to write to the blocks following the logical order of the set of memory dies, as described in more detail elsewhere herein.

In a fourth operation 625, process 600 may include determining a first starting point in the block stripe for writing the host write data and a second starting point in the block stripe for writing the garbage collection write data. The starting locations may be with reference to a memory die. For example, the starting location may be a first memory die to be written to for each respective write operation associated with the block stripe. For example, process 600 may include selecting a memory die, from the set of memory dies, to be a starting memory die for a first write operation (e.g., for the host write operation and/or the garbage collection write operation). The starting memory die may be referred to as a separate memory die. The first write operation may be associated with a first logical write direction, as explained in more detail below.

In some implementations, process 600 may include randomly selecting the memory die from the set of memory dies (e.g., using a randomization factor). For example, the separate die may be randomly selected when the block stripe is constructed. In other words, a random factor (such as Randomized-QuickSort) may be used to select the separate die. This may result in each die associated with the block stripe having an equal, or similar, chance to be selected as the separate die (e.g., as the starting location for a first write operation). As explained in more detail below, the selected (e.g., randomly selected) starting location may determine which blocks include multiple types of data (e.g., some blocks of the block stripe may be written with both host write data and garbage collection write data). By randomly selecting the separate die (e.g., as the starting location for a first write operation), the block(s) of the block stripe that include different types of data may be distributed among the memory dies associated with the block stripe. Because a block that include multiple types of data (e.g., hot data and cold data) may decrease an efficiency of certain operations, such as the garbage collection operation, distributing block (s) that include different types of data among the memory dies associated with the block stripe may ensure that a single block does not include a disproportionate quantity of blocks having different types of data (e.g., thereby ensuring that a given memory die does not experience a disproportionate negative impact on the efficiency of the certain operations).

In some implementations, process 600 may include selecting a second starting location (e.g., a starting memory die) for a second write operation (e.g., for the host write operation and/or the garbage collection write operation) associated with the block stripe. In some implementations, the second starting location may be based on the first starting location (e.g., the randomly selected separate die). For example, the second starting location may be a memory die that is adjacent to the separate die in the order (e.g., the logical order) of the memory dies. For example, the first write operation (e.g., the host write operation) and the second write operation (e.g., the garbage collection write operation) may be associated with different (e.g., opposite) write directions following the order (e.g., the logical order) of the memory dies. The second starting location may be a memory die that is adjacent to the separate die in the write direction associated with the second write operation, as depicted and described in more detail in connection with FIG. 8.

In some implementations, in a fifth operation 630, process 600 may include determining a first write direction following the order of the memory dies for a first write operation (e.g., the host write operation) and a second write direction following the order of the memory dies for a second write operation (e.g., the garbage collection write operation). For example, the order (e.g., the logical order) of the memory dies may be {0, 1, 2, 3, 4, 5, 6, 7}, where the values represent index values or logical addresses of respective memory dies. In some implementations, the separate die (e.g., the starting location for the first write operation) may be the memory die "3" and a starting location for the second write operation may be the memory die "2." In such example, the first write direction may follow an order of writing to block(s) of the block stripe in memory dies {3, 4, 5, 6, 7, 0, 1, 2, 3, 4, . . . }. The second write direction may follow an order of writing to block(s) of the block stripe in memory dies {2, 1, 0, 7, 6, 5, 4, 3, 2, 1, . . . }. In other words, the first write direction and the second write direction are opposite directions following the order (e.g., the logical order) of the memory dies associated with the block stripe.

In a sixth operation 635, process 600 may include programming first data to a first one or more memory blocks of the block stripe following the first logical write direction associated the logical order of the set of memory dies. For example, starting at the separate die, host write data may be written to blocks of the block stripe following the logical order of the set of memory dies and in the first logical direction (e.g., the first write direction). In a seventh operation 640, process 600 may include programming second data to a second one or more memory blocks of the block stripe following a second logical write direction associated with the logical order of the set of memory dies. For example, garbage collection write data (e.g., valid data being folding from one or more victim blocks) may be programed to the second one or more memory blocks starting at a different memory die (e.g., different than the separate die), from the set of memory dies, and following the second logical write direction. As described above, the different memory die may adjacent to the separate die in the logical order of the set of memory dies (e.g., with respect to the second logical write direction).

In some implementations, the sixth operation 635 and the seventh operation 640 (e.g., which may collectively be referred to as a "write operation") may be associated with a dynamic word line start voltage. For example, a word line starting voltage may refer to a starting voltage (e.g., selected from a sequence of increasing voltages) applied to a word line to program (e.g., perform a program operation on) memory cells associated with (e.g., coupled to) the word line. In performing a dynamic word line start voltage operation, one or more incremented voltages in a sequence of incremented voltages may be applied to determine the lowest voltage at which a first page of word lines may be programmed with valid data (e.g., a word line start voltage). Other pages of the same word line may be programmed by a word line start voltage determined for a first page of the word line. This may reduce a programming time of the write operation. For example, the word line start voltage may be increased to more closely match the word line start voltage of the first page of memory cells and the remaining pages of word lines are programmed using the same increased word line start voltage. Determining an appropriate word line start voltage for the first page of word lines may allow for bypassing (e.g., skipping) lower word line start voltages in the sequence of incrementing voltages. Utilizing an increased word line start voltage determined for the first page may enable utilizing fewer of the incremental voltages in the sequence of incremental voltages to determine appropriate word line start voltages for other pages associated with the same word line. As described elsewhere herein, if different block stripes (and/or write cursors) were to be used for the host write operation and the garbage collection write operation, then the dynamic word line start voltage operation may not be used to program the data. By using a single block stripe (e.g., associated with a mixed write cursor), the dynamic word line start voltage operation may be applied, thereby reducing a programming time of the write operation.

As shown in FIG. 6, process 600 may include programming the first data and program the second data according to a weighted ratio. In other words, process 600 may include programming the first data in a first quantity of pages (e.g., in the sixth operation 635), and programming the second data in a second quantity of pages after programming the first data in the first quantity of pages. A ratio of the first quantity to the second quantity may be the weighted ratio. For example, process 600 may include writing to N pages for the host write operation (e.g., as described herein), followed by writing to M pages for the garbage collection write operation (e.g., as described herein), followed by writing to N pages for the host write operation, and so on (e.g., where N:M is the weighted ratio). In some implementations, the weighted ratio of the first quantity to the second quantity is based on a quantity of pages included in respective blocks of the one or more blocks. In some examples, the weighted ratio of the first quantity to the second quantity may be based on a valid page count of a victim block stripe, as described elsewhere herein. In other words, the weighted ratio may be chosen to result in host write data and garbage collection write data forming respective page stripes during the write operation. For example, if a page stripe (e.g., and/or a block) includes 32 pages, then the weighted ratio may be approximately 1:2.4 (e.g., 1:2 and/or 1:3 because partial page writes may not be possible). This may reduce a likelihood of a given block (or a given page stripe) including mixed data (e.g., including both host write data and garbage collection write data). Reducing the quantity of blocks and/or page stripes that include mixed data may improve an efficiency of the memory device 120 and/or the memory system (e.g., by reducing a likelihood that hot data and cold data are stored together in the same block and/or page stripe).

In some implementations, process 600 may include selecting or constructing a victim block stripe for the garbage collection operation. For example, the block stripe (e.g., that is constructed for the mixed write cursor, as described in more detail elsewhere herein) may not be used to obtain and/or collect valid data to be used in the garbage collection write operation. This may be because the block stripe (e.g., that is constructed for the mixed write cursor, as described in more detail elsewhere herein) may have a higher valid translate unit count (e.g., due to writing hot data to the block stripe), which would result in a less efficient garbage collection operation. Rather, a different block stripe may be constructed as the victim block stripe for the garbage collection operation. In some implementations, constructing the victim block stripe may include selecting one or more victim blocks associated with the set of memory dies to form the victim block stripe associated with the garbage collection operation. For example, each memory die may select a block (e.g., a victim block) to be included in the victim block stripe.

In some implementations, the one or victim blocks are different than the one or more blocks included in the block stripe (e.g., the victim block stripe and the block stripe where the valid data associated with the garbage collection operation is folded may be different blocks and/or different block stripes). For example, process 600 may include folding (e.g., in the seventh operation 640) the second data from the one or more victim blocks into the one or more blocks as part of the garbage collection operation. For example, the seventh operation 640 may include collecting the second data from the different block stripe (e.g., the victim block stripe) as part of a garbage collection operation.

In some implementations, for a given memory die, selecting a victim block to be included in the victim block stripe may include selecting the victim block from a set of memory blocks associated with the memory die based on a valid translate unit count or a valid page count associated with the victim block. In other words, selecting the victim block to be included in the victim block stripe may include selecting, for a memory die included in the set of memory dies, a block to be included in the victim block stripe based on the block having a lowest valid translate unit count and/or a lowest valid page count among blocks associated with the memory die. In this way, the victim block stripe may be dynamically constructed to included blocks having a lowest valid translate unit count and/or a lowest valid page count, thereby improving an efficiency of the garbage collection operation.

As indicated above, FIG. 6 is provided as an example. Other examples may differ from what is described with regard to FIG. 6.

Figure 7:
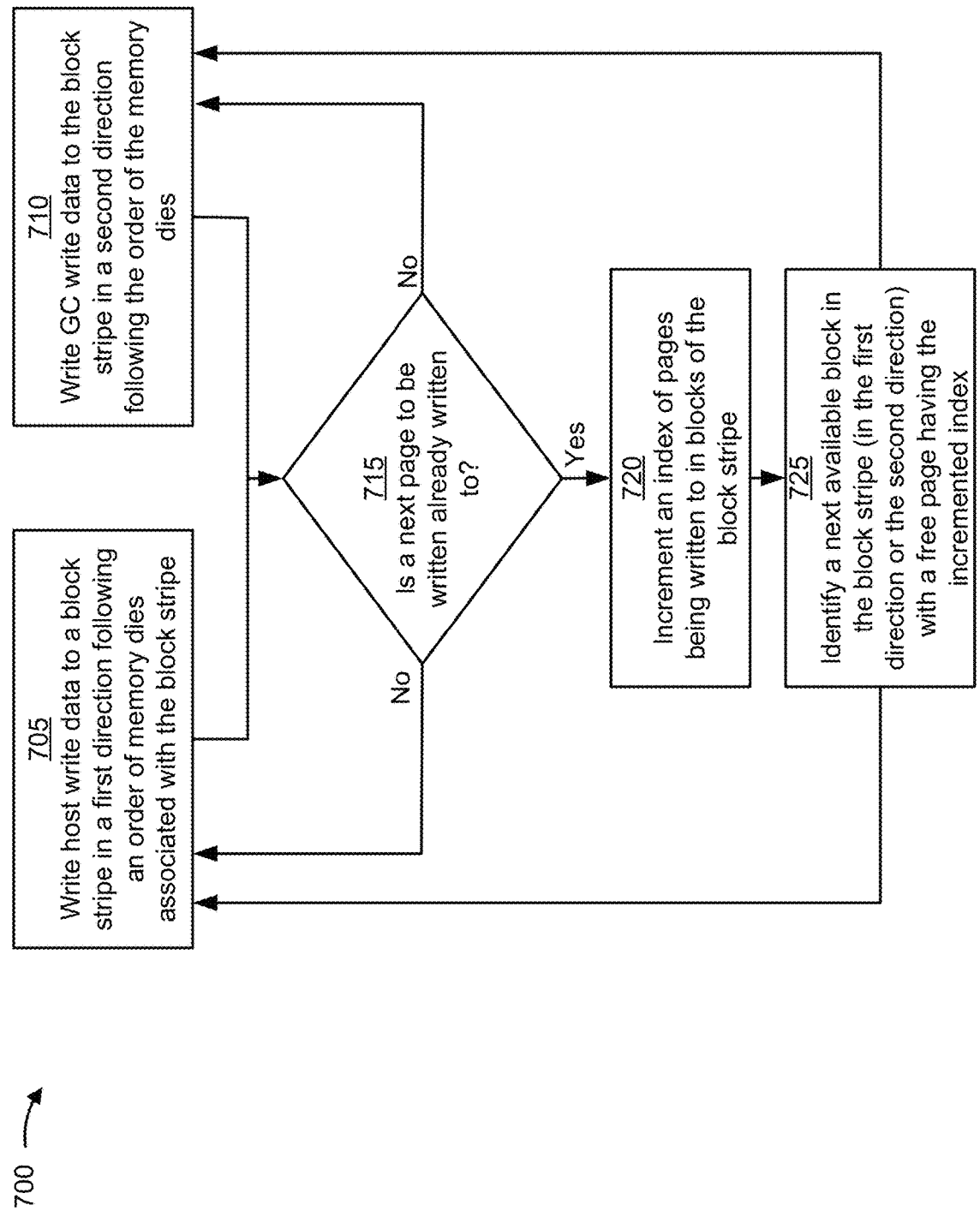
FIG. 7 is a diagram illustrating an example process associated with a mixed write cursor for block stripe writing.

FIG. 7 is a diagram illustrating an example process 700 associated with a mixed write cursor for block stripe writing. Functions and/or operations described herein associated with the example process 700 may be performed by the memory device 120, the controller 130, the memory management component 250, the write component 260, the garbage collection component 270, and/or the block stripe construction component 280. In some implementations, process 700 may be part of, or may be performed in conjunction with, process 600.

For example, in a first operation 705, process 700 may include writing host data to a block stripe in a first direction following an order of memory dies associated with the block stripe (e.g., in a similar manner as described in connection with FIG. 6 and/or the sixth operation 635). In a second operation 710, process 700 may include writing garbage collection write data to the block stripe in a second direction following the order of the memory dies associated with the block stripe (e.g., in a similar manner as described in connection with FIG. 6 and/or the seventh operation 640).

In a third operation 715, process 700 may include determining whether a next page to be written to (e.g., for the host write data and/or the garbage collection write data) is already written to. If the next page to be written to is free (e.g., No), then process 700 may include continuing to write the host write data and the garbage collection write data as described in more detail elsewhere herein. If the next page to be written to is occupied (e.g., has already had host write data or garbage collection write data programmed) (e.g., Yes), then process 700 may include, in a fourth operation 720, incrementing an index of pages being written to in blocks of the block stripe (e.g., for the first operation 705 and/or the second operation 710).

For example, process 700 may include detecting that first data and second data are both to be programmed to a page included in a memory block of the block stripe (e.g., following the first write direction and the second write direction for the host write data and the garbage collection write data, respectively). Process 700 may include incrementing the index of pages being written to in blocks of the block stripe to move "down" the blocks to a next available page based on detecting that first data and second data are both to be programmed to the page (e.g., following the first write direction and the second write direction for the host write data and the garbage collection write data, respectively).

In a fifth operation 725, process 700 may include identifying a next available block in the block stripe (e.g., in the first direction or the second direction) with a free page having the incremented index value. For example, the write operation may be associated with writing to a first page index of blocks associated with the block stripe (e.g., writing to a page having the first page index of a first block, followed by writing to a page having the first page index of a second block, followed by writing to a page having the first page index of a third block, and so on). When the write direction results in a next block being occupied by data of the other write operation (e.g., occupied by host write data or garbage collection write data), then the index of page(s) being written to may be incremented (e.g., may be increased or decreased by an amount). For example, after incrementing the index, the write operation (e.g., the host write operation or the garbage collection write operation) may be associated with writing to pages having a second index. As shown in FIG. 7, process 700 may include programming the first data to a page (e.g., having the incremented page index) in a next memory block, from the memory block, following a first write direction. In some implementations, process 700 may include programming second data to a second page (e.g., also having the incremented page index) in a next memory block, from the memory block, following the second write direction.

As indicated above, FIG. 7 is provided as an example. Other examples may differ from what is described with regard to FIG. 7.

FIG. 8 is a diagram illustrating an example block stripe 800 associated with a mixed write cursor. For example, the block stripe (e.g., block stripe A) depicted in FIG. 8 may be constructed and/or programmed using one or more operations or processes described elsewhere herein.

As shown in FIG. 8, the block stripe A may be associated with both host write data and garbage collection write data (e.g., folding write data). For example, a single block may be selected (e.g., dynamically) from respective memory dies (e.g., memory dies 0 through 7) to be included in the block stripe A. The respective memory dies may be associated with an order (e.g., a logical order) as depicted in FIG. 8 (e.g., from memory die 0 to memory die 7). As shown in FIG. 8, a starting location for writing the host write data be selected as the memory die 3. In other words, the memory die 3 may be randomly selected to be the starting location (e.g., the separate die) for the host write data. The starting location for writing the garbage collection data may be the memory die 2 because the memory die 2 is adjacent to the separate die (e.g., the memory die 3) with respect to write direction associated with the garbage collection write operation (e.g., the folding write direction).

The host write data may be written in a first write direction (e.g., the host write direction as shown in FIG. 8) starting from the separate die (e.g., the memory die 3). The garbage collection write data may be written in a second write direction (e.g., the folding write direction as shown in FIG. 8) starting from the memory die 2. For example, the numbers in different pages as depicted in FIG. 8 (e.g., HW 0, HW 1, FW 0, FW 1, and so on) may represent an order in which data as written for the respective operations. For example, the host write data be written following an order of HW 0, HW 1, HW 2, HW 3, HW 4, and so on. Similarly, the garbage collection write data may be written following an order of FW 0, FW 1, FW 2, FW 3, FW 4, and so on.

As described elsewhere herein, the host write data and the garbage collection write data may be written to the block stripe A in a weighted ratio. For example, the weighted ratio may be 1:2 for host writes to garbage collection writes. For example, the HW 0 may be written to a first page of the memory die 3. Subsequently, the FW 0 may be written to a first page of the memory die 2 and the FW 1 may be written to a first page of the memory die 1. Subsequently, the HW 1 may be written to a first page of the memory die 4. Subsequently, the FW 2 may be written to a first page of the memory die 0 and the FW 3 may be written to a first page of the memory die 7. This pattern may continue for a write operation for the block Stripe A that is associated with a mixed write cursor.

Writing or programming data to the block stripe A using the weighted ratio may improve a likelihood that a given block (or page stripe) may include only a single type of data (e.g., only host write data or only garbage collection write data). For example, as shown in FIG. 8, following the pattern described above may result in most blocks of the block stripe A being associated with a single type of data (e.g., host write data or garbage collection data and/or hot data or cold data). As a result, an efficiency of memory operations may be improved because a given block or page stripe may not include different types of data (e.g., may not include both hot data and cold data).

In some cases, as shown in FIG. 8, a memory block may include a first one or more pages associated with first data (e.g., host write data) and a second one or more pages associated with second data (e.g., garbage collection data). For example, in the block stripe A, the block associated with the memory die 5 may be associated with both host write data and garbage collection data. However, by randomly selecting the starting location (e.g., the separate die) for the host write operation, a location of block(s) that include both host write data and garbage collection data may be distributed (e.g., evenly distributed) among the memory dies as data is written to multiple block stripes (e.g., as depicted in FIG. 9).

In some cases, a next page to be written following a write direction may be occupied (e.g., as described in connection with FIG. 7). For example, after writing the FW 10, the folding write direction may indicate that garbage collection data is to be written to a page in the block associated with the memory die 4. However, the page in the block associated with the memory die 4 may have already had the HW 4 data programmed. Therefore, the pages being written to may be incremented such that the garbage collection write operation writes to a next page (e.g., moving down the pages as depicted in FIG. 8) of the blocks included in the block stripe A. For example, rather than writing to the page in the block associated with the memory die 4, the FW 11 may be written to an incremented page index (e.g., from the page in the block associated with the memory die 4) in the memory die 2 (e.g., the next available block following the folding write direction).

As indicated above, FIG. 8 is provided as an example. Other examples may differ from what is described with regard to FIG. 8.

FIG. 9 is a diagram illustrating example block stripes 900 associated with mixed write cursors. For example, the block stripes depicted in FIG. 9 may be constructed and/or programmed using one or more operations or processes described elsewhere herein. For example, FIG. 9 may depict an example memory array layout following mixed write operations, as described herein.

For example, after writing to all pages of blocks associated with a first block stripe (e.g., block stripe 1 as shown in FIG. 9 and/or block stripe A as shown in FIG. 8), another one or more blocks associated with the set of memory dies may be selected to form another block stripe for writing data associated with the host write operation and the garbage collection operation for another write operation. In other words, another block stripe (e.g., a block stripe 2) may be dynamically constructed for the mixed write cursor, as described in more detail elsewhere herein. For example, a starting location (e.g., a separate die) for the block stripe 2 may be randomly selected. In other words, the block stripe 1 may be associated with a first memory die, of the set of memory dies, that is a first starting point for the write operation. The block stripe 2 may be associated with a second memory die, of the set of memory dies, that is a second starting point for the another write operation. For example, the first memory die and the second memory die may be randomly selected from the set of memory dies (e.g., the first memory die and the second memory die may be the same memory die, or may be different memory dies as depicted in FIG. 9).

As shown in FIG. 9, this may result in block(s) containing mixed data being distributed among the memory dies. For example, as data in written to different block stripes, blocks or page stripes containing mixed data (e.g., containing both host write data and garbage collection write data and/or including both hot data and cold data) may be distributed among the memory dies. This may improve an efficiency of memory operation and/or may address problems associated with writing hot data and cold data together. For example, because hot data (e.g., host write data) and cold data (e.g., garbage collection data) may be written to different blocks and/or different page stripes of respective block stripes (e.g., because of the weighted ratio and/or the randomly selected separate die), blocks may be selected for a garbage collection operation (e.g., victim blocks) that include lower valid page counts (e.g., because hot data and cold data may typically not be written to the same block even though the hot data and the cold data are written to the same block stripe). Moreover, because of the randomly selected separate die, even when hot data and cold data may be written to the same block of a block stripe, a same memory die may not continually include blocks having both hot data and cold data. This may improve an efficiency of a garbage collection operation.

As indicated above, FIG. 9 is provided as an example. Other examples may differ from what is described with regard to FIG. 9.

FIG. 10 is a flowchart of an example method 1000 associated with a mixed write cursor for block stripe writing. In some implementations, a memory device (e.g., memory device 120) may perform or may be configured to perform one or more process blocks of FIG. 10. In some implementations, another device or a group of devices separate from or including the memory device (e.g., the host device 110) may perform or may be configured to perform one or more process blocks of FIG. 10. Additionally, or alternatively, one or more components of the memory device (e.g., the controller 130, the memory 140, the memory management component 250, the write component 260, the garbage collection component 270, and/or the block stripe construction component 280) may perform or may be configured to perform one or more process blocks of FIG. 10.

As shown in FIG. 10, the method 1000 may include selecting one or more blocks associated with a set of memory dies of the memory device to form a block stripe for writing data associated with a host write operation and a garbage collection operation, wherein the host write operation is associated with first data obtained from a host, and wherein the garbage collection operation is associated with folding data from a different block stripe (block 1010). As further shown in FIG. 10, the method 1000 may include programming the first data associated with the host write operation to the block stripe (block 1020). As further shown in FIG. 10, the method 1000 may include programming second data associated with the garbage collection operation to the block stripe, wherein the first data and the second data are both programmed to the block stripe in a write operation (block 1030).

Although FIG. 10 shows example blocks of a method 1000, in some implementations, the method 1000 may include additional blocks, fewer blocks, different blocks, or differently arranged blocks than those depicted in FIG. 10. Additionally, or alternatively, two or more of the blocks of the method 1000 may be performed in parallel. The method 1000 is an example of one method that may be performed by one or more devices described herein. These one or more devices may perform or may be configured to perform one or more other methods based on operations described herein, such as the operations described in connection with FIGS. 6-9.

In some implementations, a memory system includes a set of memory dies; and one or more components configured to: construct a block stripe associated with a write cursor, wherein the block stripe is associated with memory blocks from respective memory dies of the set of memory dies, and wherein the write cursor is associated with programming first data associated with a host write operation and with programming second data associated with a garbage collection operation; program the first data to a first one or more memory blocks of the block stripe following a first logical write direction associated a logical order of the set of memory dies; and program the second data to a second one or more memory blocks of the block stripe following a second logical write direction associated with the logical order of the set of memory dies.

In some implementations, a method includes selecting, by a memory device, one or more blocks associated with a set of memory dies of the memory device to form a block stripe for writing data associated with a host write operation and a garbage collection operation, wherein the host write operation is associated with first data obtained from a host, and wherein the garbage collection operation is associated with folding data from a different block stripe; programming, by the memory device, the first data associated with the host write operation to the block stripe; and programming, by the memory device, second data associated with the garbage collection operation to the block stripe, wherein the first data and the second data are both programmed to the block stripe in a write operation.

In some implementations, a system includes means for programming, as part of a write operation, first data to a block stripe associated with a set of memory dies, wherein the first data is associated with a host write operation, and wherein the first data is written to blocks included in the block stripe in a first direction following an order of the set of memory dies; and means for programming, as part of the write operation, second data to the block stripe, wherein the second data is associated with a folding write operation, and wherein the second data is written to the blocks included in the block stripe in a second direction following the order of the set of memory dies.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory system, comprising:
   a set of memory dies; and
   one or more components configured to:
      construct a block stripe associated with a write cursor,
         wherein the block stripe is associated with memory blocks from respective memory dies of the set of memory dies, and
         wherein the write cursor is associated with programming first data associated with a host write operation and with programming second data associated with a garbage collection operation;
      program the first data to a first one or more memory blocks of the block stripe following a first logical write direction associated a logical order of the set of memory dies; and
      program the second data to a second one or more memory blocks of the block stripe following a second logical write direction associated with the logical order of the set of memory dies.

2. The memory system of claim 1, wherein the one or more components, to construct the block stripe, are configured to:
   arrange the memory blocks of the block stripe in an order corresponding to the logical order of the set of memory dies; and
   select a memory die, from the set of memory dies, to be a starting memory die for the first logical write direction.

3. The memory system of claim 2, wherein the one or more components, to select the memory die, are configured to:
   randomly select the memory die from the set of memory dies using a randomization factor.

4. The memory system of claim 2, wherein the one or more components, to program the first data, are configured to:
   program the first data to the first one or more memory blocks starting at the memory die and following the first logical write direction; and
   wherein the one or more components, to program the second data, are configured to:
      program the second data to the second one or more memory blocks starting at a different memory die, from the set of memory dies, and following the second logical write direction.

5. The memory system of claim 4, wherein the different memory die is adjacent to the memory die in the logical order of the set of memory dies.

6. The memory system of claim 1, wherein a memory block is included in both the first one or more memory blocks and the second one or more memory blocks, and wherein the memory block includes a first one or more pages associated with the first data and a second one or more pages associated with the second data.

7. The memory system of claim 1, wherein the one or more components are configured to program the first data and program the second data according to a weighted ratio.

8. The memory system of claim 1, wherein the one or more components are further configured to:
   detect that the first data and the second data are both to be programmed to a page included in a memory block of the block stripe;
   program the first data to a first page in a next memory block, from the memory block, following the first logical write direction; and program the second data to a second page in a next memory block, from the memory block, following the second logical write direction,
- wherein the first page and the second page have a first index that is incremented from a second index value of the page.

9. The memory system of claim 1, wherein the one or more components, to construct the block stripe, are configured to:
- construct the block stripe by dynamically selecting the memory blocks based on detecting that the block stripe is needed for at least one of the host write operation or the garbage collection operation.

10. A method, comprising:
- selecting, by a memory device, one or more blocks associated with a set of memory dies of the memory device to form a block stripe for writing data associated with a host write operation and a garbage collection operation,
  - wherein the host write operation is associated with first data obtained from a host, and
  - wherein the garbage collection operation is associated with folding data from a different block stripe;
- programming, by the memory device, the first data associated with the host write operation to the block stripe; and
- programming, by the memory device, second data associated with the garbage collection operation to the block stripe,
  - wherein the first data and the second data are both programmed to the block stripe in a write operation.

11. The method of claim 10, wherein programming the first data comprises:
- programming, in the write operation, the first data in a first direction of a logical order of the set of memory dies, and
- wherein programming the second data comprises:
  - programming, in the write operation, the second data in a second direction of the logical order of the set of memory dies.

12. The method of claim 10, wherein programming the first data comprises:
- programming, in the write operation, the first data in a first quantity of pages, and
- wherein programming the second data comprises:
  - programming, in the write operation, the second data in a second quantity of pages after programming the first data in the first quantity of pages, and
  - wherein a ratio of the first quantity to the second quantity is based on a quantity of pages included in respective blocks of the one or more blocks.

13. The method of claim 10, further comprising:
- selecting one or more victim blocks associated with the set of memory dies to form a victim block stripe associated with the garbage collection operation,
  - wherein the one or victim blocks are different than the one or more blocks included in the block stripe, and
- wherein programming the second data comprises:
  - folding the second data from the one or more victim blocks into the one or more blocks as part of the garbage collection operation.

14. The method of claim 13, wherein selecting the one or more victim blocks comprises:
- selecting, for a memory die of the set of memory dies, a victim block from a set of memory blocks associated with the memory die based on a valid translate unit count associated with the victim block.

15. The method of claim 10, further comprising:
- storing an indication of the one or more blocks included in the block stripe.

16. The method of claim 15, wherein storing the indication of the one or more blocks included in the block stripe comprises:
- storing a single indication, of blocks that are included in the block stripe, associated with two or more memory dies, from the set of memory dies, that are logically coupled.

17. The method of claim 10, wherein the write operation is associated with a dynamic word line start voltage.

18. The method of claim 10, further comprising:
- selecting another one or more blocks associated with the set of memory dies of the memory device to form another block stripe for writing data associated with the host write operation and the garbage collection operation for another write operation,
  - wherein the block stripe is associated with a first memory die, of the set of memory dies, that is a first starting point for the write operation, and
  - wherein the other block stripe is associated with a second memory die, of the set of memory dies, that is a second starting point for the other write operation.

19. The method of claim 18, wherein the first memory die and the second memory die are randomly selected from the set of memory dies.

20. A system, comprising:
- means for programming, as part of a write operation, first data to a block stripe associated with a set of memory dies,
  - wherein the first data is associated with a host write operation, and
  - wherein the first data is written to blocks included in the block stripe in a first direction following an order of the set of memory dies; and
- means for programming, as part of the write operation, second data to the block stripe,
  - wherein the second data is associated with a folding write operation, and
  - wherein the second data is written to the blocks included in the block stripe in a second direction following the order of the set of memory dies.

21. The system of claim 20, further comprising:
- means for dynamically selecting the blocks included in the block stripe based on initiating the write operation.

22. The system of claim 20, wherein the first data is written to pages associated with a first index, of a first one or more blocks of the blocks, from a starting memory die, of the set of memory dies, and following the first direction in the order of the set of memory dies, and
- wherein the second data is written to pages associated with the first index, of a second one or more blocks of the blocks, from a memory die adjacent to the starting memory die in the order of the set of memory dies, and following the second direction in the order of the set of memory dies.

23. The system of claim 22, wherein the means for programming the first data comprise:
- means for detecting that a next page as indicated by following the first direction in the order of the set of memory dies has been written to with the second data; and means for programming the first data to a page, associated with a second index, in a next available block as indicated by following the first direction in the order of the set of memory dies.

24. The system of claim 20, further comprising:

means for selecting blocks from the set of memory dies to form a different block stripe; and means for collecting the second data from the different block stripe as part of a garbage collection operation.

25. The system of claim 24, wherein the means for selecting the blocks to form the different block stripe comprise:

means for selecting, for a memory die included in the set of memory dies, a block to be included in the different block stripe based on the block having a lowest valid page count among blocks associated with the memory die.

* * * * *